United States Patent [19]

Sakata et al.

[11] Patent Number: 5,622,787
[45] Date of Patent: Apr. 22, 1997

[54] MASK FOR TRANSFERRING A PATTERN FOR USE IN A SEMICONDUCTOR DEVICE AND METHOD OF MANUFACTURING THE SAME

[75] Inventors: Hirofumi Sakata; Tadashi Nishioka, both of Hyogo, Japan

[73] Assignees: Mitsubishi Denki Kabushiki Kaisha, Tokyo; Ryoden Semiconductor Systems Engineering Corporation, Hyogo, both of Japan

[21] Appl. No.: 311,441

[22] Filed: Sep. 26, 1994

[30] Foreign Application Priority Data

Dec. 9, 1993 [JP] Japan .................. 5-309248

[51] Int. Cl.$^6$ ............................ H01L 21/30
[52] U.S. Cl. .................. 428/620; 428/652; 428/665; 428/642; 428/630; 148/DIG. 104
[58] Field of Search .................. 428/620, 652, 428/665, 642, 630; 148/DIG. 103, DIG. 104, DIG. 105; 437/228 M; 430/5

[56] References Cited

U.S. PATENT DOCUMENTS

| | | | |
|---|---|---|---|
| 3,740,280 | 6/1973 | Ronen | 148/DIG. 105 |
| 4,981,771 | 1/1991 | Mochiji et al. | 430/322 |
| 5,115,456 | 5/1992 | Kimura et al. | 378/35 |
| 5,154,949 | 10/1992 | Shindo et al. | 427/253 |
| 5,181,132 | 1/1993 | Shindo et al. | 359/58 |
| 5,233,211 | 8/1993 | Hayashi et al. | 257/347 |

FOREIGN PATENT DOCUMENTS

| | | |
|---|---|---|
| 55-18604 | 2/1980 | Japan . |
| 55-158635 | 12/1980 | Japan . |
| 57-198632 | 12/1982 | Japan . |
| 3-155120 | 7/1991 | Japan . |
| 4-72714 | 3/1992 | Japan . |

OTHER PUBLICATIONS

English abstract for JP 04-72,714 (Mar. 1992).
English abstract for JP 55-158,635 (Dec. 1980).
English abstract for JP 55-18604 (Feb. 1980).
Kubaschewski et al, "Oxidation of Metals and Alloys", 2nd ed., QD 171 K 8, 1962, pp. 1, 35–38.
"Antireflective MOSI Photomasks", Chiba et al., J. Vac. Sci. Technol. B 10(6), Nov./Dec. 1992, pp. 2480–2485.
"High–Resolution Lithography With A Vacuum STM", Marian et al., Ultramicroscopy 42–44 (1992), pp. 1309–1316.
"From Molecules To Cells: Imaging Soft Samples With The Atomic Force Microscope", M. Radmacher et al., Science vol. 257, Sep. 25, 1992, pp. 1900–1905.
"Scanning Tunneling Microscope Instrumentation", Kuk et al., Rev. Sci. Instrum. 60(2), Feb. 1989, pp. 165–180.
"Pattern Generation on Semiconductor Surfaces by a Scanning Tunneling Microscope Operating in Air", Dagata et al., J. Vac. Sci. Technol. B9(2), Mar./Apr. 1991, pp. 1384–1388.
"Area Selective Aluminum Patterning by Atomic Hydrogen Resist", Tsubouchi et al., Extended Abstracts of the 1992 International Conference on Solid State Devices and Materials, pp. 208–210.
"Single–Crystal Silicon on a Sapphire Substrate", Manasevit and Simpson, Journal of Applied Physics, vol. 35, No. 4, Apr. 1964, pp. 1349–1351.

(List continued on next page.)

Primary Examiner—Ngoc-Yen Nguyen
Attorney, Agent, or Firm—Lowe, Price, LeBlanc & Becker

[57] ABSTRACT

A mask for transferring a pattern in which durability can be improved and a very fine circuit pattern of a light-shielding film can be formed, and a manufacturing method thereof are obtained. In the mask for transferring a pattern, a silicon monocrystalline film 2, an aluminum monocrystalline film 3 and an aluminum oxide film 4 are formed on a mask substrate 1 so as to have a prescribed pattern feature. Silicon monocrystalline film 2 and aluminum monocrystalline film 3 serve as the light-shielding film. Aluminum oxide film 4 serves as an anti reflection and protection film.

6 Claims, 10 Drawing Sheets

OTHER PUBLICATIONS

"Vapor Phase Epitaxial Growth of MgO.Al$_2$O$_3$", Ihara et al., vol. 129, No. 11 Electrical Properties, pp. 2569–2573., Nov. 1982.

"Epitaxial Growth of Deposited Amorphous Layer by Laser Annealing", Lau et al., Appl. Phys. Lett. 33(2), 15 Jul. 1978, pp. 130–131.

"Ideal Hydrogen Termination of the SI (111) Surface", Higashi et al, Appl. Phys. Lett. 56(7), 12 Feb. 1990, pp. 656–658.

"Mechanism of HF Etching of Silicon Surface: A Theoretical Understanding of Hydrogen Passivation", Trucks et al., vol. 65, No. 4, Physical Review Letters, pp. 504–507, Jul. 1990.

"Proximity Effects", Brodie et al., THe PHysics of Microfabrications, pp. 338–339, 1982 (no month).

"Electron–Beam Lithography", Brodie et al., The Physics of Microfabrication, pp. 312–320., 1982 (no month).

MASK FOR TRANSFERRING A PATTERN FOR USE IN A SEMICONDUCTOR DEVICE AND METHOD OF MANUFACTURING THE SAME

BACKGROUND OF THE INVENTION

1. Field of the Invention

The present invention relates to a mask for transferring a pattern and manufacturing method thereof, and more particularly, to a mask for transferring a pattern for use in a semiconductor device.

2. Description of the Background Art

A conventional mask for transferring a pattern for use in a semiconductor device (hereinafter referred to as a "mask") is disclosed, for example, in J: Vac. Sci. Technol. B, Vol. 10, No. 6, pp. 2480–2485 (1992) by Akira Chiba, Shuichi Matsuda, and Yaichiro Watakabe. FIG. 16 is a sectional view showing the conventional mask disclosed. Referring to FIG. 16, in the conventional mask 100, an optically opaque light-shielding film 102 is formed on a prescribed region of a surface of an optically transparent mask substrate 101. On light-shielding film 102, an antireflection film 103 for reducing light reflectance of mask substrate 102 is formed. Mask substrate 101, light-shielding film 102 and antireflection film 103 are formed, for example, of a quartz glass substrate, a molybdenum silicide (MoSi) film and a molybdenum silicide oxide film, respectively.

A method of using the above-described conventional mask 100 will now be described. First, a resist (not shown) is formed on a semiconductor substrate (not shown). Then, for example, ultraviolet is directed to the resist through mask 100. Since ultraviolet passes only through a region where light-shielding film 102 does not exist, a region in the resist corresponding to light-shielding film 102 is not irradiated with ultraviolet. Consequently, there exist regions irradiated and not irradiated with ultraviolet. That is, there exist regions exposed and not exposed to ultraviolet in the resist. The exposed region or the unexposed region is then removed with developer. Thus, a resist pattern is formed. A resist pattern is formed for each manufacturing step of a semiconductor device by using mask 100 in this manner.

FIGS. 17–20 are sectional views showing a manufacturing process of the conventional mask shown in FIG. 16. A manufacturing method of the conventional mask will now be described with reference to FIGS. 17–20.

First, as shown in FIG. 17, a light-shielding film 102a made of a MoSi film is formed on mask substrate 101, using sputtering and vacuum evaporation. An antireflection film 103a made of a molybdenum silicide oxide film is formed on light-shielding film 102a by the oxidizing light-shielding film (molybdenum silicide film) 102a. A photo-sensitive polymer film (resist) 104a is formed on antireflection film 103a.

Then, as shown in FIG. 18, a mask pattern is formed on resist 104a by directing an electron beam 105 to a prescribed region of resist 104a. A resist pattern 104 shown in FIG. 19 is then formed by performing a developing process.

Then, patterned antireflection film 103 and light-shielding film 102 as shown in FIG. 20 are formed by etching antireflection film 103a and light-shielding film 102a using resist pattern 104 as a mask. Finally, the conventional mask shown in FIG. 16 is completed by removing resist 104.

In the above-described manufacturing process of the conventional mask, however, there are the following problems. That is, in a step shown in FIG. 18, when electron beam 105 is directed to resist 104a, diameter of electron beam 105 can not be reduced due to the restriction of the optical system. More specifically, it is difficult to reduce the diameter of electron beam 105 to about 40 Å or less. Therefore, conventionally, it is difficult to form fine resist pattern 104. Consequently, it has been difficult to form a fine circuit pattern of light-shielding film 102.

As a result, methods using Scanning Tunneling Microscope (STM) instead of the electron beam have been proposed as a method to expose a resist. These are disclosed, for example, in C. R. K. Marrian and E. A. Dobisz: Ultramicroscopy Vol. 42–44, pp. 1309–1316 (1992).

FIG. 21 schematically shows the conventionally proposed method of exposing a resist using STM. Referring to FIG. 21, a voltage of 10 V or less is applied between a probe 106 of STM and light-shielding film 102a and antireflection film 103a. In this proposed example, resist 104a is exposed to electrons emitted from probe 106 of STM. Since diameter of an electron current emitted from probe 106 is about 1 Å or less, finer resist pattern can be formed compared to that in the method using the electron beam shown in FIG. 18.

In the conventionally proposed method, however, electrons emitted from probe 106 are scattered within resist 104a and are scattered due to their collision with antireflection film 103a. These phenomena are referred to as proximity effect. If the above-described scattering of electrons occurs, a region which is not to be exposed could also be exposed. Therefore, accuracy of the resulting resist pattern decreases and finer resist pattern cannot be formed.

In addition, in the conventional mask, light-shielding film (molybdenum silicide film) 102 and antireflection film (molybdenum silicide oxide film) 103 can easily be damaged mechanically during use. Since light-shielding film (molybdenum silicide film) 102 is formed by sputtering or vacuum evaporation, molybdenum silicide film 102 is made of a polycrystalline film which includes a collection of fine crystal grains. Accordingly, molybdenum silicide film (light-shielding film) 102 can easily be deformed if external force is applied during use.

Antireflection film (molybdenum silicide oxide film) 103 on light-shielding film (molybdenum silicide film) 102 is formed by oxidizing light-shielding film (molybdenum silicide film) 102 made of a polycrystalline film which is a collection of fine crystal grains. Therefore, quality of antireflection film (molybdenum silicide oxide film) 103 reflects that of light-shielding film (polycrystalline film) 102. Consequently, it is difficult to form dense antireflection film 103. Accordingly, conventional antireflection film 103 can easily be deformed if the external force is applied during use. Conventionally, it is difficult to increase the number of times the mask can be used, since light-shielding film (molybdenum silicide film) 102 and antireflection film (molybdenum silicide oxide film) 103 can easily be deformed during use.

SUMMARY OF THE INVENTION

It is an object of the present invention to increase the number of times a mask for transferring a pattern can be used, by preventing a light-shielding film from being damaged mechanically.

It is another object of the present invention to easily form finer circuit pattern of a light-shielding film in a method of manufacturing the mask for transferring a pattern.

It is a further object of the present invention to form a very fine circuit pattern of the light-shielding film without using a resist in the method of manufacturing the mask for transferring a pattern.

A mask for transferring a pattern in accordance with one aspect of the present invention is provided with a transparent substrate having a main surface, a semiconductor monocrystalline film formed with a prescribed pattern feature on the main surface of the transparent substrate, a metal monocrystalline film formed on the semiconductor monocrystalline film, and a metal oxide film formed on the metal monocrystalline film.

In the mask for transferring a pattern, since a light-shielding film including the semiconductor monocrystalline film formed on the transparent substrate and the metal monocrystalline film formed thereon, the light-shielding film is less susceptible to deformation than the conventional light-shielding film formed of a polycrystalline film which can easily be deformed mechanically. Thus, the number of times the mask can be used will be increased. If the metal oxide film on the metal monocrystalline film is formed by oxidizing the metal monocrystalline film, the metal oxide film comes to have such quality that reflects the quality of the metal monocrystalline film having fewer defects. Thus, dense metal oxide film can be formed and hardness of the metal oxide film will be increased. As a result, durability of the mask will further be improved.

A mask for transferring a pattern in accordance with another aspect of the present invention is provided with a transparent substrate having a main surface, an alloy solid solution film made of solid solution of semiconductor monocrystal and metal monocrystal formed with a prescribed pattern feature on the main surface of the transparent substrate, and a metal oxide film formed on the alloy solid solution film.

In the mask for transferring a pattern, since the light-shielding film is formed of the alloy solid solution, which is hard, made of solid solution of the semiconductor monocrystal and the metal monocrystal, the light-shielding film is less susceptible to mechanical damage during use than the conventional light-shielding film formed of the polycrystalline film which is easily deformed mechanically. Thus, durability of the mask can further be improved.

The method of manufacturing a mask for transferring a pattern in accordance with a further aspect of the present invention includes the steps of forming a semiconductor monocrystalline film on a transparent substrate having a main surface, terminating the main surface of the semiconductor monocrystalline film with hydrogen atoms, forming a pattern of hydrogen atoms having a prescribed pattern feature by replacing a portion of the hydrogen atoms at the main surface of the semiconductor monocrystalline film with oxygen atoms, forming a metal monocrystalline film on the pattern of the hydrogen atoms, and forming a metal oxide film on the metal monocrystalline film.

In the method of manufacturing the mask for transferring a pattern, since the main surface of the semiconductor monocrystalline film formed on the main surface of the transparent substrate is terminated with hydrogen atoms, a pattern of the hydrogen atoms having a prescribed pattern feature is formed by replacing a portion of the hydrogen atoms with oxygen atoms, and the metal monocrystalline film is formed on the pattern of the hydrogen atoms, a very fine pattern of the metal monocrystalline film can easily be formed without using a resist. Moreover, if a metal oxide film is formed on the metal monocrystalline film and a portion which is not covered with the metal oxide film is then removed, a light-shielding film with a very fine pattern, which includes the metal monocrystalline film and the semiconductor monocrystalline film, can be formed.

As the above-mentioned further aspect of the present invention, a method of manufacturing a mask for transferring a pattern in accordance with still further aspect of the present invention includes the steps of forming a semiconductor monocrystalline film, terminating a main surface of the semiconductor monocrystalline film with hydrogen atoms, forming a pattern of the hydrogen atoms, forming a metal monocrystalline film, and forming a metal oxide film. The method further includes the step of forming an alloy solid solution film by thermally diffusing semiconductor atoms within the semiconductor monocrystalline film into the metal monocrystalline film by thermal processing.

In the mask for transferring a pattern, since the main surface of the semiconductor monocrystalline film formed on the transparent substrate is terminated with hydrogen atoms, a pattern of the hydrogen atoms having a prescribed pattern feature is formed by replacing a portion of the hydrogen atoms with oxygen atoms, the metal monocrystalline film is formed on the pattern of the hydrogen atoms, and the alloy solid solution film is formed by thermally diffusing the semiconductor atoms within the semiconductor monocrystalline film into the metal monocrystalline film by thermal processing, a pattern of the alloy solid solution is the same as that of the hydrogen atoms. Thus, the alloy solid solution film (light-shielding film) having a finer pattern can easily be formed without using a resist.

The foregoing and other objects, features, aspects and advantages of the present invention will become more apparent from the following detailed description of the present invention when taking in conjunction with the accompanying drawings.

DESCRIPTION OF THE PREFERRED EMBODIMENTS

Embodiments of the present invention will now be described with reference to the drawings.

Figure 1:
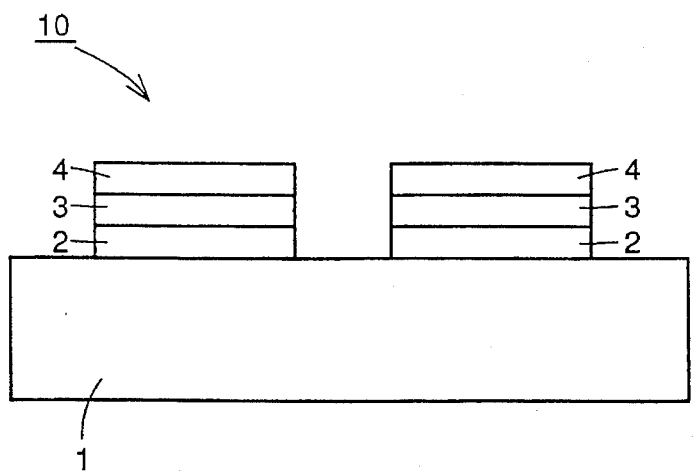
FIG. 1 is a sectional view showing a mask in accordance with a first embodiment of the present invention.

Referring to FIG. 1, in a mask 10 of a first embodiment, a silicon monocrystalline film 2 is formed on a prescribed region of a main surface of a mask substrate 1 made of a sapphire plate or a spinel ($MgO \cdot Al_2O_3$) plate. That is, silicon monocrystalline film 2 is located on mask substrate 1 so as to correspond to a circuit pattern for each manufacturing step of a semiconductor device.

On silicon monocrystalline film 2, an aluminum monocrystalline film 3 is formed so as to have the same circuit pattern as that of silicon monocrystalline film 2. An aluminum oxide film ($Al_2O_3$ film) 4 is formed on aluminum monocrystalline film 3. Silicon monocrystalline film 2 has a thickness of about 200 to about 500 nm, and both aluminum monocrystalline film 3 and aluminum oxide film 4 have a thickness of about 50 to about 100 nm.

Silicon monocrystalline film 2 and aluminum monocrystalline film 3 form a light-shielding film of mask 10. Aluminum oxide film 4 with its thickness set to a prescribed value functions as an antireflection film. More specifically, spectral reflectance of a two-layer structure of aluminum monocrystalline film 3 and aluminum oxide film 4 within a specific range of wavelength is calculated using an optical constant of aluminum monocrystalline film 3 and aluminum oxide film 4. If aluminum oxide film 4 is formed so as to have a thickness which minimizes the spectral reflectance, aluminum oxide film 4 can function as an antireflection film. This can suppress "edge portion exposure effect", i.e. the effect that an edge portion of aluminum monocrystalline film 3 is exposed when light reflectance of aluminum monocrystalline film 3 is large.

In the mask of the first embodiment, silicon monocrystalline film 2 and aluminum monocrystalline film 3 form a light-shielding film. Since a monocrystalline film has fewer defects which cause reduction in mechanical strength than a polycrystalline film, the light-shielding film formed of silicon monocrystalline film 2 and aluminum monocrystalline film 3 is less susceptible to deformation even if external force is applied during use, resulting in the improvement in the number of times the mask of the first embodiment can be used over the conventional mask.

Since aluminum oxide film 4 is formed by oxidizing a surface of aluminum monocrystalline film 3 as will be described later, quality of aluminum oxide film 4 reflects the quality of aluminum monocrystalline film 3 which is less defective. Thus, dense aluminum oxide film 4 can be formed. Consequently, hardness of aluminum oxide film 4 can be improved. Therefore, aluminum oxide film 4 serves as a protection film for aluminum monocrystalline film 3. Thus, durability of mask 10 can be further improved.

The method of manufacturing the mask of the first embodiment will now be described with reference to FIGS. 2–9.

Figure 2:
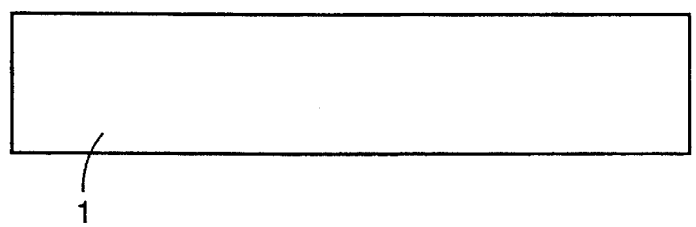
FIGS. 2–9 are sectional views illustrating first to eighth steps of a manufacturing process of the mask of the first embodiment shown in FIG. 1, respectively.
Figure 3:
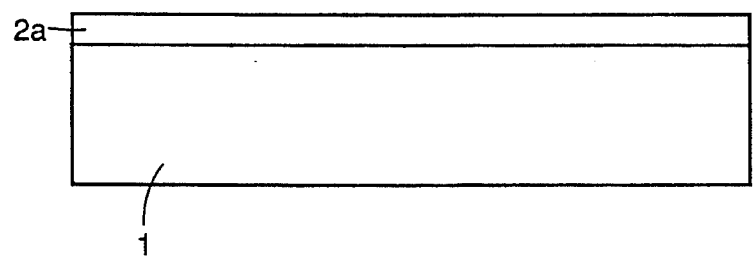

First, as shown in FIG. 2, mask substrate 1 formed of a spinel plate or a sapphire plate is prepared. Then, as shown in FIG. 3, a silicon monocrystalline film 2a having a thickness of about 200 to about 500 nm is formed on one surface of mask substrate 1. More specifically, if mask substrate 1 is a sapphire plate, silicon monocrystalline film 2a is formed on mask substrate 1 using vapor deposition in which crystal growth is achieved by resolving silicon tetrachloride ($SiCl_4$) in hydrogen atmosphere. If mask substrate 1 is a spinel plate, silicon monocrystalline film 2a is formed on mask substrate 1 using vapor deposition in which crystal growth is achieved by resolving silane ($SiH_4$) in hydrogen atmosphere. In the above-described vapor deposition, it is preferred to form n-type or p-type silicon monocrystalline film 2a having low specific resistance by adding arsine ($AsH_3$), phosphine ($PH_3$) or diborane ($B_2H_6$) to silicon tetrachloride and silane. Laser anneal may be performed in order to improve crystal property of silicon monocrystalline film 2a formed in the above-described manner.

Figure 4:
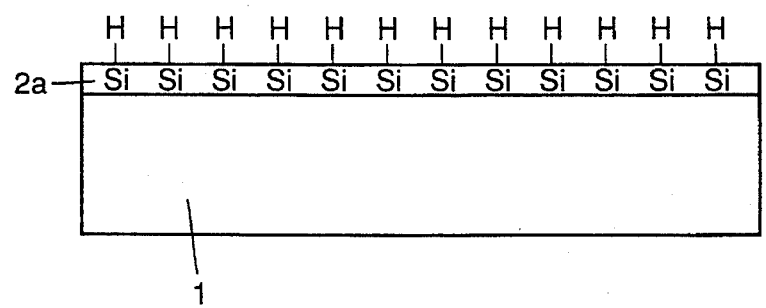

Then, as shown in FIG. 4, silicon monocrystalline film 2a and mask substrate 1 are impregnated into a solution of hydrofluoric acid (HF content of 1–1.5%), or a mixed solution of ammonium fluoride ($NH_4F$ content of 40%) and hydrofluoric acid (HF content of 50%) in a volume ratio of 50:1. Thus, natural silicon oxide film ($SiO_2$ film) is removed and outermost bonds of silicon atoms are terminated with hydrogen atoms. Consequently, the surface of silicon monocrystalline film 2a can be cleaned and kept chemically stable for a long time. Such a method is disclosed, for example, in Appl. Phys. Lett., Vol. 56, No. 7, pp. 656–658 (1990) and Phys. Rev. Lett., Vol. 65, No. 4, pp. 504–507 (1990).

Figure 5:
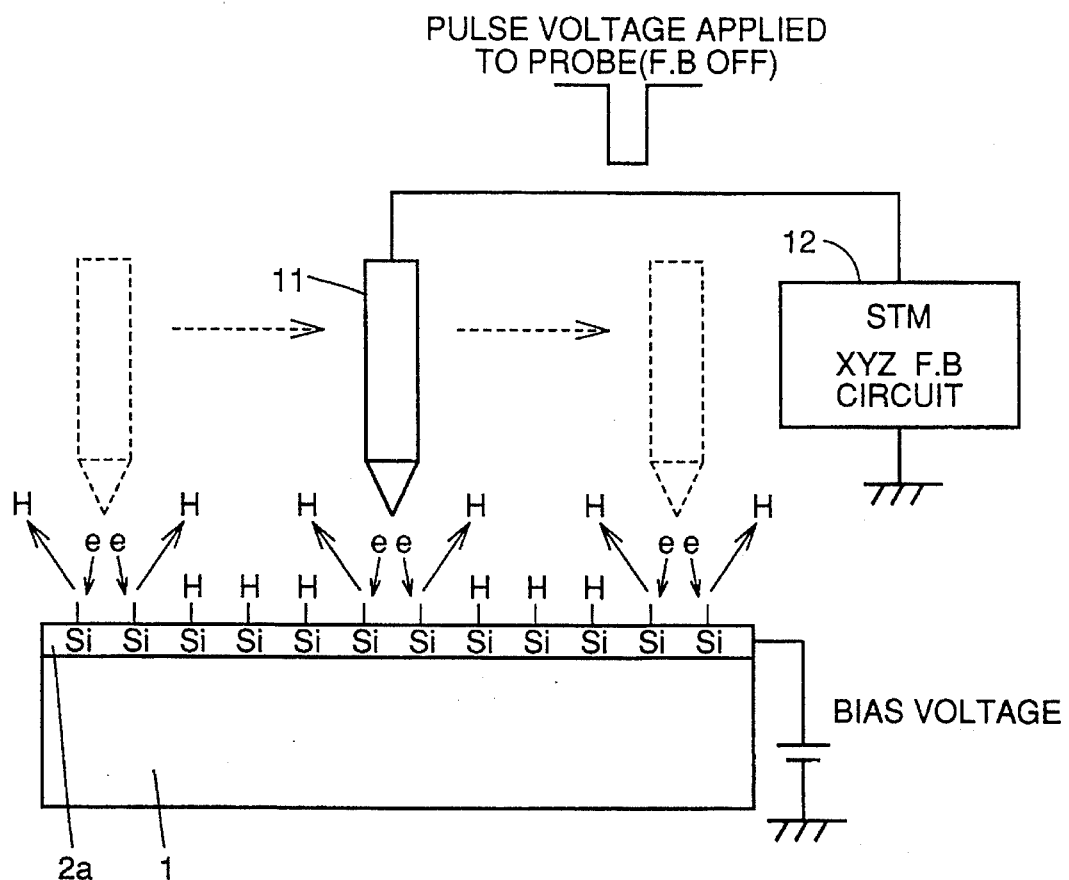

Then, as shown in FIG. 5, the surface of silicon monocrystalline film 2a terminated with hydrogen atoms is scanned by a probe 11, which is made of tungsten, of STM. The scanning by this probe 11 is carried out in the X-Y direction parallel to the surface of silicon monocrystalline film 2a. Distance between silicon monocrystalline film 2a and probe 11 is controlled by a feedback (F.B) circuit 12 of STM so that it is kept constant. More specifically, a constant bias voltage in the range of +0.5 to 1.0 V is applied to silicon monocrystalline film 2a. In addition, a tunneling current between probe 11 and silicon monocrystalline film 2a is kept at a constant value in the range of 0.5 to 1 mA. Thus, the distance between probe 11 and silicon monocrystalline film 2a can be kept constant.

In the above-described STM apparatus, a relatively low pulse voltage is applied to probe 11 when it scans a region other than a prescribed pattern region. The pulse voltage must be set to such a value that can prevent movement of silicon atoms in silicon monocrystalline film 2a to another position caused by large electric field strength and thermal evaporation and that can prevent significant deformation of a tip shape of probe 11. More specifically, pulse voltage having a voltage value of 1.5 to 2 V and a pulse width of 2 to 5 msec is applied with silicon monocrystalline film 2a positive and probe negative.

When the pulse voltage is applied, the operation of the F.B circuit is stopped. On the other hand, before and after the pulse voltage is applied, the tunneling current is kept constant by operating the F.B circuit. Thus, before and after the application of the pulse voltage, the distance between silicon monocrystalline film 2a and probe 11 is kept constant.

Figure 6:
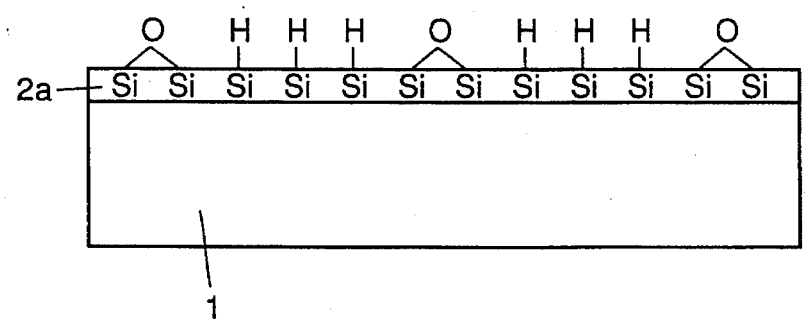

By the above-described application of the pulse voltage, hydrogen atoms (H) near the tip of probe 11 are replaced with oxygen atoms (O). That is, a pattern of oxygen atoms (O) shown in FIG. 6 is formed in a region, which will not later be a light-shielding film (not shown), by applying the pulse voltage to the prescribed region. The width of the pattern of oxygen atoms can easily be controlled by the number of scan lines by probe 11 and the number of application of the pulse voltage.

In a manufacturing process of the mask of the first embodiment, a pattern of hydrogen atoms is formed by STM without using a resist. Thus, electrons emitted from probe 11 of STM are not scattered within the resist. In addition, diameter of electron current emitted from probe 11 of STM is about 1 Å or less. Consequently, a very fine pattern of hydrogen atoms can easily be formed. Moreover, a light-shielding film having a very fine circuit pattern can be formed by a process, which will be described later, using the pattern of hydrogen atoms as a base.

Figure 7:
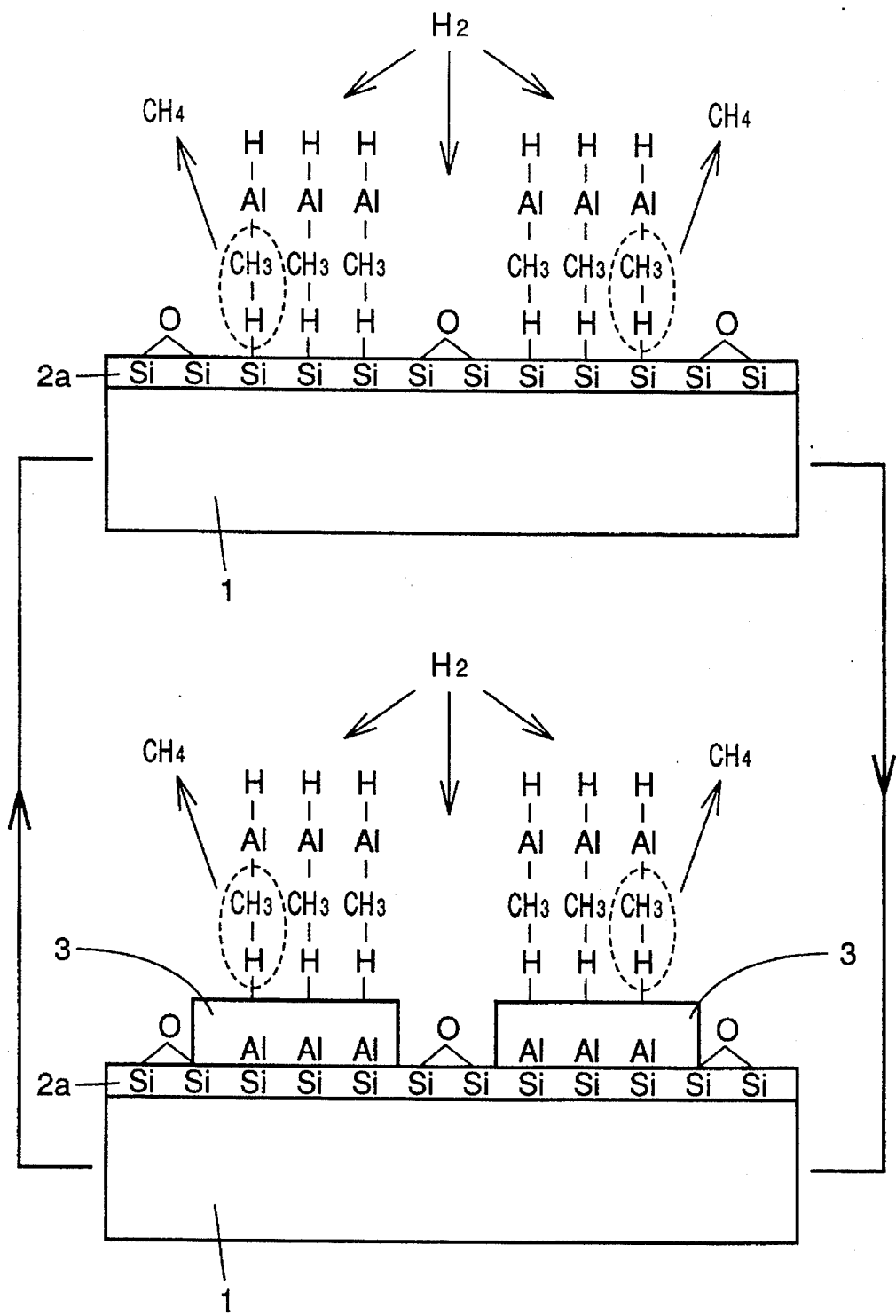

Then, as shown in FIG. 7, an aluminum monocrystalline film 3 is formed on the portion, where hydrogen atoms remain, of the surface of silicon monocrystalline film 2a using organic metal vapor deposition. That is, hydrogen atoms (H) are replaced with aluminum atoms (Al) in an atmosphere containing hydrogen gas and DMAH [$(CH_3)_2AlH$] gas, using low pressure vapor deposition.

More specifically, hydrogen atoms (H) on silicon monocrystalline film 2a are bound to methyl groups ($CH_3$—), turned to methane ($CH_4$), and evaporate. Thus, aluminum atoms (Al) bound to hydrogen atoms (H) remain on the surface of silicon monocrystalline film 2a. The hydrogen atoms bound to the aluminum atoms (Al) are again bound to methyl groups ($CH_3$—), turned to methane ($CH_4$), and evaporate. As a result, aluminum atoms (Al) bound to other hydrogen atoms remain on the surface of silicon monocrystalline film 2a. Aluminum monocrystalline film 3 can be formed on a prescribed region of silicon monocrystalline film 2a by repeating the above-described reaction cycle of generating methane ($CH_4$) and aluminum atoms (Al).

Figure 8:
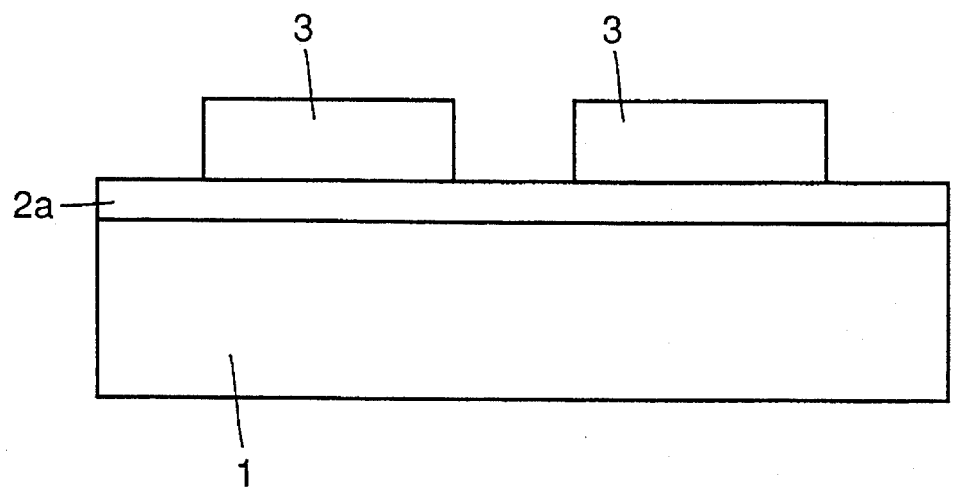

Specifically, aluminum monocrystalline film 3 is formed under the conditions of a temperature of 250° to 300° C., a reduced pressure of 1 to 2 Torr and a partial pressure of 1 to $5 \times 10^{-3}$ Torr. Thus, aluminum monocrystalline film 3 having a thickness of about 100 to about 200 nm as shown in FIG. 8 can be formed.

Figure 9:
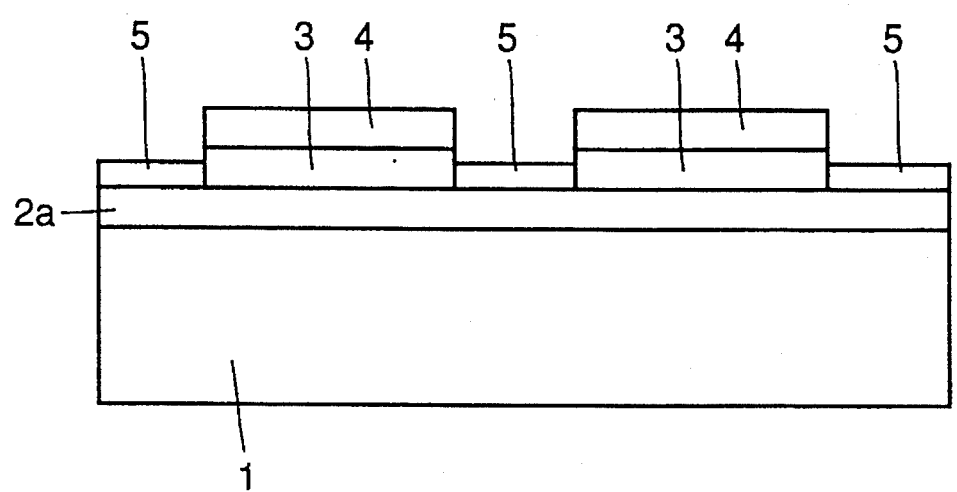

Then, as shown in FIG. 9, the surface of silicon monocrystalline film 2a and the surface of aluminum monocrystalline film 3 are oxidized in an atmosphere containing oxygen or water vapor at a temperature not higher than the melting point of aluminum monocrystalline film 3. Thus, a silicon oxide film ($SiO_2$) 5 and an aluminum oxide film ($Al_2O_3$) 4 are formed. Pilling-Bedworth ratio of $Al_2O_3$ to Al is 1.28. The Pilling-Bedworth ratio represents the degree of the film density. The Pilling-Bedworth ratio of 1.28 indicates that aluminum oxide film 4 is extremely dense. Therefore, hardness of aluminum oxide film 4 is large. Thus, aluminum oxide film 4 can serve as a protection film for aluminum monocrystalline film 3.

After silicon oxide film 5 and aluminum oxide film 4 are formed as described above, a portion of silicon monocrystalline film 2a, which is terminated with oxygen atoms (a portion located under silicon oxide film 5) and silicon oxide film 5 are removed. More specifically, the whole mask is impregnated at room temperature into an etchant in which nitric acid ($HNO_3$ content of 70%) and hydrofluoric acid (HF content of 50%) are mixed in the volume ratio of 10:1. Silicon oxide film 5 and silicon monocrystalline film 2a thereunder are dissolved by this etchant, while aluminum oxide film 4 will not be dissolved by the above-described etchant, since aluminum oxide film 4 is dense and hardly dissolved in the above-described etchant. Consequently, silicon monocrystalline film 2, aluminum monocrystalline film 3 and aluminum oxide film 4 having a prescribed pattern feature shown in FIG. 1 can be formed. Thus, the mask of the first embodiment is completed.

Figure 10:
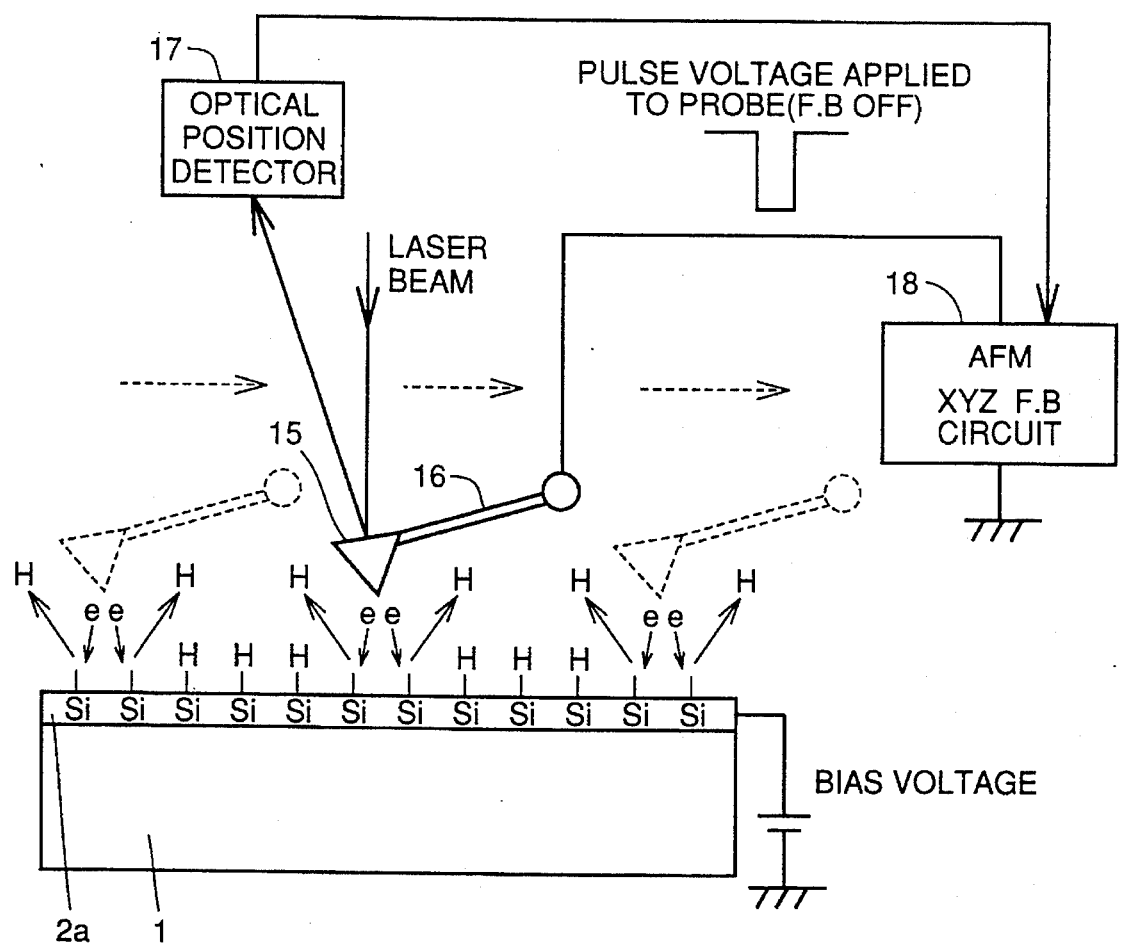
FIG. 10 is a schematic diagram showing a modification of the manufacturing process of FIG. 5.

FIG. 10 schematically illustrates a modification of the step of replacing hydrogen atoms with oxygen atoms shown in FIG. 5. Referring to FIG. 10, in this modification, an Atomic Force Microscope (AFM) is used instead of the Scanning Tunneling Microscope (STM) shown in FIG. 5. AFM is disclosed, for example, in Science.VOL. 257.25 SEPTEMBER 1992 pp. 1900–1905. AFM includes a cantilever 16 having a shape of a plate spring, a probe 15 attached to a tip of cantilever 16, an optical position detector 17 for detecting an amount of displacement of cantilever 16, and a feedback (F.B) circuit 18 for controlling a distance between probe 15 and silicon monocrystalline film 2a based on a detection signal from optical position detector 17. A bias voltage is applied to silicon monocrystalline film 2a.

In order to replace hydrogen atoms (H) with oxygen atoms (O) using such an AFM, cantilever 16 and probe 15 are required to be conductive. Therefore, in this modification, cantilever 16 and probe 15 coated with a thin deposition film of gold, or cantilever 16 and probe 15 formed of semiconductor with low resistance such as silicon are used. In a method of replacing hydrogen atoms (H) with oxygen atoms (O), probe 15 scans in the X-Y direction as in the case of STM shown in FIG. 5. A pulse voltage is applied to probe 15 in scanning a region other than prescribed pattern region. Hydrogen atoms (H) near the tip of probe 15 are replaced with oxygen atoms by the pulse voltage. Thus, a pattern of oxygen atoms (O) similar to that shown in FIG. 6 is formed.

In the method using AFM, since the distance between silicon monocrystalline film 2a and probe 15 is kept constant by using interatomic force, it is not necessary to provide tunneling current flowing between silicon monocrystalline film 2a and probe 15 as in the case of using STM shown in FIG. 5. Therefore, in the method using AFM, it is not necessary to reduce specific resistance of silicon monocrystalline film 2a in order to prevent reduction in tunneling current flowing at silicon monocrystalline film 2a. Accordingly, in the method using AFM, silicon monocrystalline film 2a having larger specific resistance than the method using STM can be used.

Although silicon (Si) monocrystalline film 2 is formed on mask substrate 1 in the above-described mask 10 of the first embodiment, the present invention is not limited to this, and a germanium (Ge) monocrystalline film may be formed. Moreover, although aluminum monocrystalline film 3 is formed on silicon monocrystalline film 2 in mask 10 of the first embodiment, the present invention is not limited to this, and a monocrystalline film such as a tungsten (W) monocrystalline film and a gallium (Ga) monocrystalline film may be formed.

Figure 11:
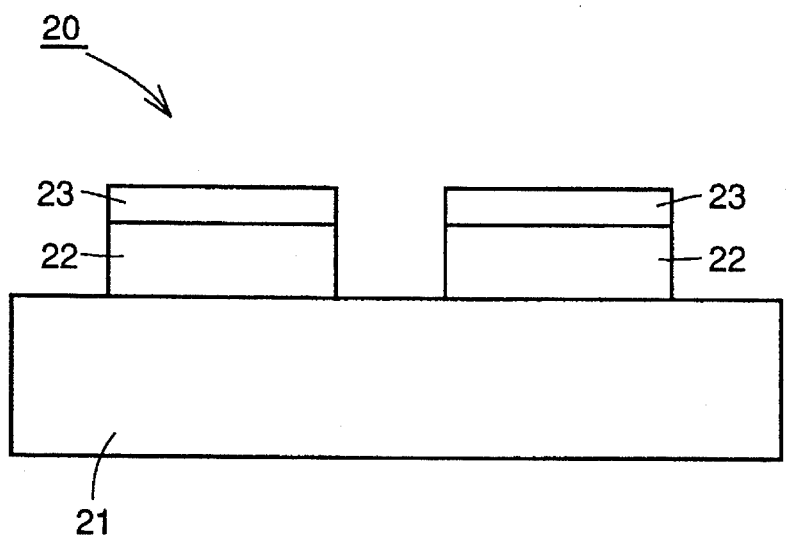
FIG. 11 is a sectional view showing a mask in accordance with a second embodiment of the present invention.

Referring to FIG. 11, in a mask 20 of a second embodiment, an aluminum-silicon (Al—Si) alloy solid solution film 22 is formed, on a mask substrate 21 made of a spinel plate or a sapphire plate, with a prescribed pattern feature. An aluminum oxide film 23 is formed on aluminum-silicon alloy solid solution film 22. Aluminum-silicon alloy solid solution film 22 has a thickness of 250 to 600 nm, and aluminum oxide film 23 has a thickness of 50 to 100 nm.

Aluminum-silicon alloy solid solution film 22 serves as a light-shielding film and aluminum oxide film 23 serves as a protection film. Aluminum-silicon alloy solid solution film 22 forming the light-shielding film in the second embodiment is harder than aluminum monocrystalline film 3 forming the light-shielding film in the first embodiment. Therefore, in the second embodiment, light-shielding film (aluminum-silicon alloy solid solution film) 22 is less susceptible to mechanical damage, resulting in the improvement in the number of times the mask of the second embodiment can be used over the mask of the first embodiment.

An example of a manufacturing process of the mask of the second embodiment will now be described with reference to FIG. 12.

Figure 12:
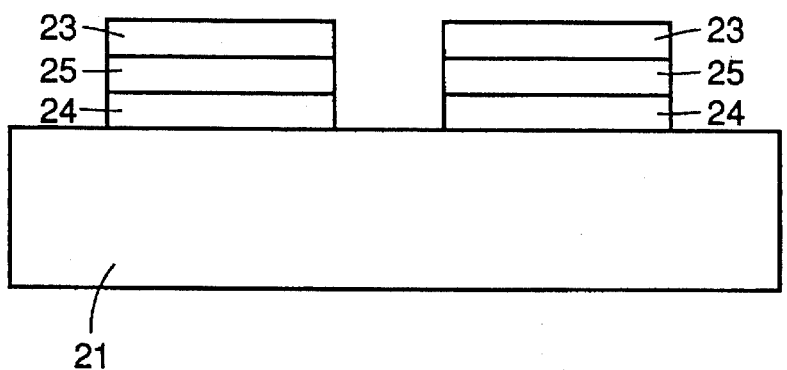
FIG. 12 is a sectional view illustrating an example of a manufacturing process of the mask in accordance with the second embodiment shown in FIG. 11.

First, a silicon monocrystalline film 24, an aluminum monocrystalline film 25 and an aluminum oxide film 23 are formed on mask substrate 21 as shown in FIG. 12, using the same manufacturing process as that of the mask of the first embodiment described above with reference to FIGS. 2–9 and FIG. 1. Then, thermal processing is performed for about 10 to 20 minutes under the temperature conditions of 550° to 580° C. Thus, silicon atoms at silicon monocrystalline film 24 are thermally diffused into aluminum monocrystalline film 25. As a result, aluminum-silicon alloy solid solution film 22 shown in FIG. 11 can be obtained.

Figure 13:
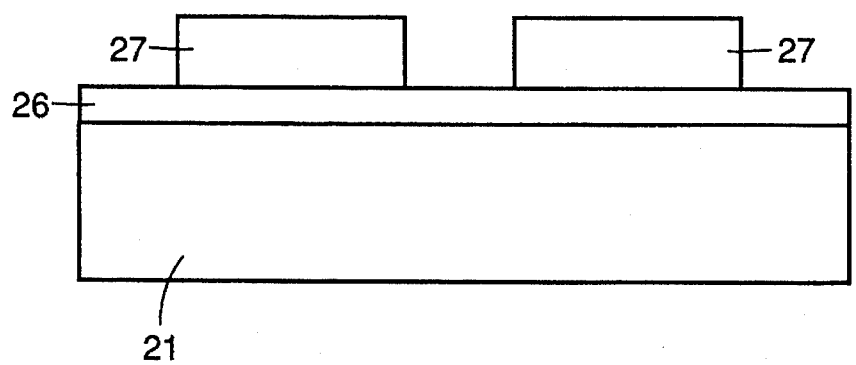
FIGS. 13–15 are sectional views illustrating first to third steps of another example of the manufacturing process of the mask in accordance with the second embodiment shown in FIG. 11, respectively.
Figure 14:
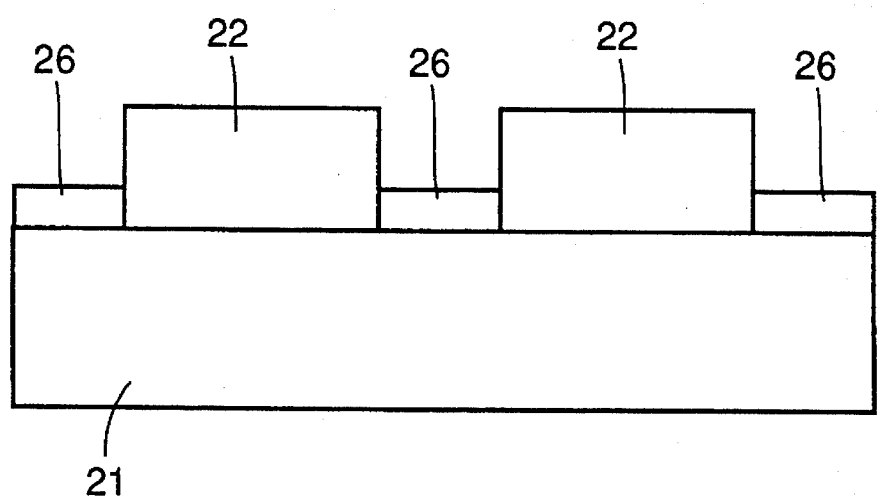

Another example of the manufacturing process of the mask of the second embodiment will now be described with reference to FIGS. 13–15.

First, a silicon monocrystalline film 26 and an aluminum monocrystalline film 27 are formed on mask substrate 21 using the same manufacturing process at that of the mask of the first embodiment described above with reference to FIGS. 2–8. Then, silicon atoms at silicon monocrystalline film 26 are thermally diffused into aluminum monocrystalline film 27 by performing thermal treatment for about 10 to 20 minutes under the temperature conditions of 550° to 580° C. Thus, an aluminum-silicon (Al—Si) alloy solid solution film 22 shown in FIG. 14 can be obtained.

Figure 15:
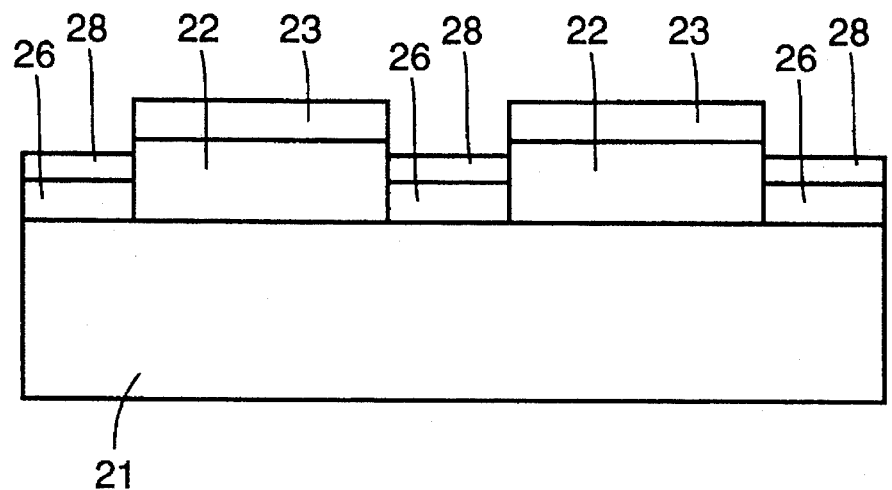
Figure 16:
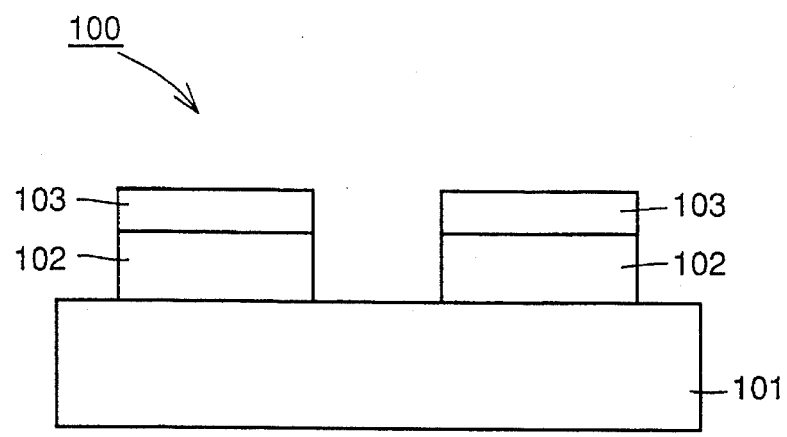
FIG. 16 is a sectional view showing a conventional mask.
Figure 17:
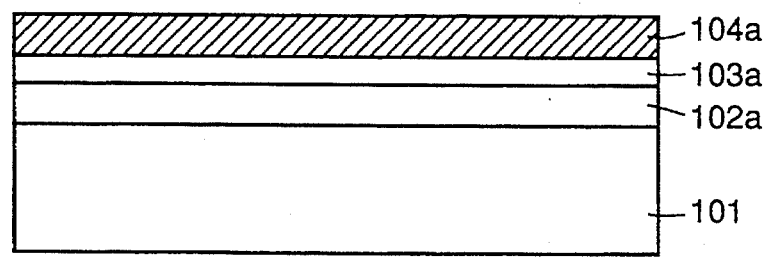
FIGS. 17–20 are sectional views illustrating first to fourth steps of a manufacturing process of the conventional mask shown in FIG. 16, respectively.
Figure 18:
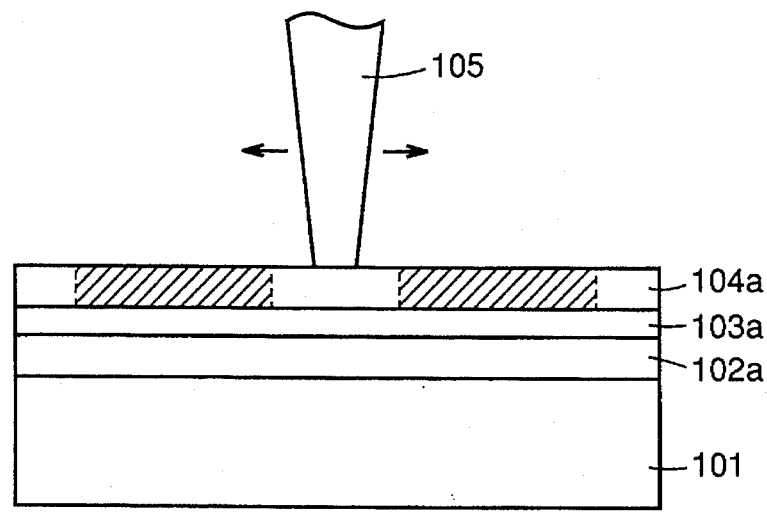
Figure 19:
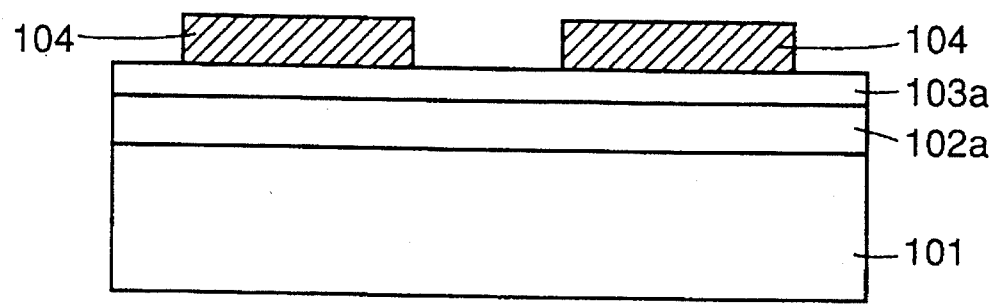
Figure 20:
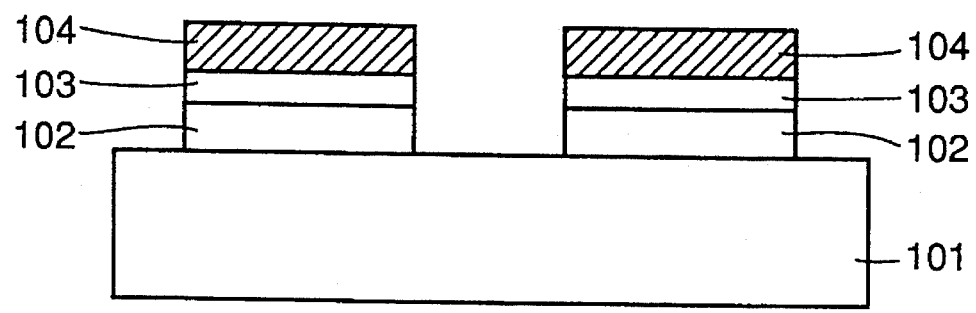
Figure 21:
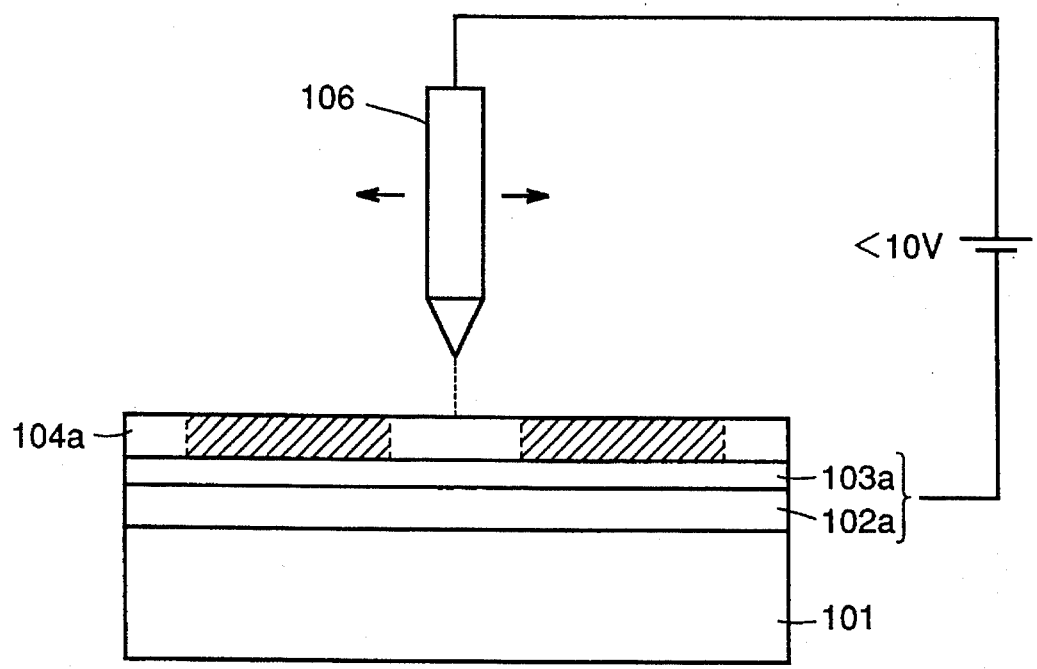
FIG. 21 is a schematic diagram showing a manufacturing method of a conventionally proposed mask.

Then, as shown in FIG. 15, a silicon oxide film 28 and an aluminum oxide film 23 are formed on a surface of silicon monocrystalline film 26 and a surface of aluminum-silicon alloy solid solution film 22, respectively, using the same manufacturing process as that of the mask of the first embodiment described above with reference to FIG. 9. Then, silicon oxide film 28 and silicon monocrystalline film 26 located thereunder are removed by etching. Thus, the mask of the second embodiment shown in FIG. 11 is formed.

A pattern of hydrogen atoms is formed using STM or AFM, and the aluminum monocrystalline film is formed on the pattern of hydrogen atoms using the organic metal vapor deposition in the above-described manufacturing process of the mask of the second embodiment, as in the case with the mask of the first embodiment. Therefore, a very fine circuit pattern of the light-shielding film can be formed without using a resist in the manufacturing process of the second embodiment, as in the case with the first embodiment.

As described above, in a mask for transferring a pattern in accordance with one aspect of the present invention, the light-shielding film includes the semiconductor monocrystalline film and the metal monocrystalline film. Since the monocrystalline film has fewer defects which cause reduction in mechanical strength than a conventionally used polycrystalline film, the light-shielding film is less susceptible to deformation even if external force is applied to the light-shielding film in using the mask for transferring a pattern, resulting in the improvement in the number of times the mask for transferring a pattern can be used. If the metal oxide film on the metal monocrystalline film is formed by oxidizing the metal monocrystalline film having fewer defects, the metal oxide film, which is very hard, can be formed. Thus, the metal oxide film can serve as a protection film for the metal monocrystalline film, resulting in the improvement in durability of the mask for transferring a pattern.

In the mask for transferring a pattern in accordance with another aspect of the present invention, the alloy solid solution film made of solid solution of semiconductor single crystal and metal single crystal forms the light-shielding film. Since the alloy solid solution film is harder than the metal monocrystalline film, the light-shielding film is less susceptible to deformation, resulting in the improvement in the number of times the mask for transferring a pattern can be used.

In the method of manufacturing a mask for transferring a pattern in accordance with one aspect of the present invention, the main surface of the semiconductor monocrystalline film formed on the transparent substrate is terminated with hydrogen atoms, a pattern of hydrogen atoms having a prescribed pattern feature is formed by replacing a portion of the hydrogen atoms with oxygen atoms, and the metal monocrystalline film is formed on the pattern of hydrogen atoms, thereby the metal monocrystalline film with a very fine pattern can be formed without using a resist. Moreover, if a metal oxide film is formed on the metal monocrystalline film and a portion which is not coated with the metal oxide film is then removed, a light-shielding film with a very fine pattern consisting of the semiconductor monocrystalline film and the metal monocrystalline film can be formed.

In the method of manufacturing the mask for transferring a pattern in accordance with another aspect of the present invention, the main surface of the semiconductor monocrystalline film on the transparent substrate is terminated with hydrogen atoms, a pattern of hydrogen atoms is formed by replacing a portion of the hydrogen atoms with oxygen atoms, a metal monocrystalline film is formed on the pattern of hydrogen atoms, and an alloy solid solution film is formed by thermally diffusing semiconductor atoms in the semiconductor monocrystalline film into the metal monocrystalline film under thermal processing, whereby the alloy solid solution film (light-shielding film) having a very fine pattern feature which is the same as that of the hydrogen atoms can easily be formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A mask for transferring a pattern comprising:

a transparent substrate having a main surface;

a semiconductor monocrystalline film formed with a pattern feature on the main surface of said transparent substrate;

a metal monocrystalline film formed on said semiconductor monocrystalline film; and a metal oxide anti-reflection film, having a thickness in the range of 50 to 100 nm, formed on said metal monocrystalline film.

2. The mask for transferring a pattern according to claim 1, wherein said semiconductor monocrystalline film includes a monocrystalline film formed of a material selected from the group consisting of silicon (Si) and germanium (Ge), and said metal monocrystalline film includes a monocrystalline film formed of a material selected from the group consisting of aluminum (Al), tungsten (W) and gallium (Ga).

3. The mask for transferring a pattern according to claim 1, wherein said semiconductor monocrystalline film has a thickness in a range of 200 to 500 nm, and said metal monocrystalline film having a thickness in a range of 50 to 100 nm.

4. A mask for transferring a pattern, comprising:

a transparent substrate having a main surface;

an alloy solid solution film of a solid solution of semiconductor single crystal and metal single crystal formed with a pattern feature on the main surface of said transparent substrate; and a metal oxide anti-reflection film formed on said alloy solid solution film.

5. The mask for transferring a pattern according to claim 4, wherein said alloy solid solution film is formed of a solid solution of silicon and aluminum.

6. The mask for transferring a pattern according to claim 4, wherein said alloy solid solution film has a thickness in a range of 250 to 600 nm, said metal oxide film having a thickness in a range of 50 to 100 nm.

* * * * *

UNITED STATES PATENT AND TRADEMARK OFFICE
CERTIFICATE OF CORRECTION

PATENT NO. : 5,622,787
DATED : April 22, 1997
INVENTOR(S) : Hirofumi SAKATA et al.

It is certified that error appears in the above-indentified patent and that said Letters Patent is hereby corrected as shown below:

Title page, item [73]
One of the Assignees, was incorrectly printed as Ryoden Semiconductor Systems Engineering Corporation but, should read as follows:

Ryoden Semiconductor System Engineering Corporation

Signed and Sealed this

Nineteenth Day of August, 1997

Attest:

BRUCE LEHMAN

Attesting Officer

Commissioner of Patents and Trademarks